ENCODER CIRCUITS

Filed Feb. 24, 1959

INVENTORS
CARL P. SPAULDING
MERTON C. WILSON

BY Christie, Parker & Hale
ATTORNEYS

United States Patent Office 3,099,003

Patented July 23, 1963

3,099,003
ENCODER CIRCUITS

Carl P. Spaulding, San Marino, and Merton Carr Wilson, Pasadena, Calif., assignors to Datex Corporation, Monrovia, Calif., a corporation of California Filed Feb. 24, 1959, Ser. No. 794,873
4 Claims. (Cl. 340—347)

This invention relates to analog to digital converters and more particularly to encoders wherein analog information represented by the angular position of a shaft is digitized by means of sensing a binary coded disc.

Analog to digital converters or encoders are presently in use to convert analog signals such as represented by angular shaft positions to digital indications by sensing a disc coded in terms of binary characters and positioned by the shaft. The binary characters arranged on the coded discs may be defined by segments having optical or electrical characteristics. Electrical characteristics may be defined by means of conductive and nonconductive segments arranged in a plurality of concentric tracks for the disc. These electrically coded segments are generally used in combination with brushes for continuously engaging the disc to sense the binary value of the segment and provide an electrical indication thereof. It has been found advantageous in some instances to code the disc in terms of a monostrophic binary code such as a Gray, cyclic or reflected binary code wherein only one binary character changes in the coding for successive decimal digits. However, the digital equipment utilizing the digital signals generally operates in terms of binary codes other than these monostrophic codes and accordingly a code translator is generally employed to translate the cyclic digital indications to a code such as a binary-coded decimal, for use by the associated equipment. This load circuit or translating equipment, which may take the form of relay translating circuits, results in transients being fed back to the encoder tending to shorten the life of the associated encoder contacts. Therefore, it is desirable to provide a simple means of extending the life of the encoder and the encoder contacts in particular. The means provided should further allow the unambiguous reproduction of the binary characters of the encoder as electrical signals.

This invention provides an improved analog to digital converter or encoder capable of a longer life than prior art devices due to the provision of isolating means arranged between the encoder contacts and the utilization or load circuit for the encoder. The improved life resulting from the use of the combination of the encoder and isolating means allows less voltage and current to be used for the encoder sensing means or brushes, permitting encoder contact resistance to vary considerably without affecting performance, and resulting in longer encoder life since electrical contact erosion is reduced and lower (mechanical) brush pressure may be used. The analog to digital converter includes a rotatable shaft carrying a coded disc having a plurality of tracks thereon and which tracks comprise two different kinds of spaced segments arranged therein to define binary characters which may be, but not necessarily, in terms of a cyclic or monostrophic code. The converter shaft is adapted to be coupled to a revolving shaft representative of the analog information to be digitized whereby means for sensing the different kinds of segments in each of the tracks provides an indication of the binary character of the sensed segment. The isolating means is adapted to continually follow the indications provided by the sensing means and to in turn unambiguously provide digital signals representative of the sensed binary characters.

The binary characters on the coded disc may be defined in terms of conductive and nonconductive segments and in which instance they may be sensed through the provision of electrical brush means arranged for continually engaging and thereby sensing these conductive and nonconductive segments. The sensed indications provided by the brush means are coupled to a switching circuit arranged intermediate the encoder and the utilization circuit for continually responding and electrically transmitting the sensed conductive and nonconductive segments of the disc as a train of digital signals. The switching circuit may comprise transistor circuit means arranged with a pair of transistors cross coupled in an asymmetrical regenerative fashion. The asymmetrical regenerative circuit means is adapted to continually follow the sensed output indications and to provide digital indications thereof by switchably continually changing its conductive condition from one state to another. The conductive conditions provided by the switching circuit may be coupled to a translating arrangement for translating the sensed information from the monostrophic code into a binary-decimal code.

These and other features of the present invention may be more fully appreciated when considered in the light of the following specification and drawings, in which.

Figure 1:
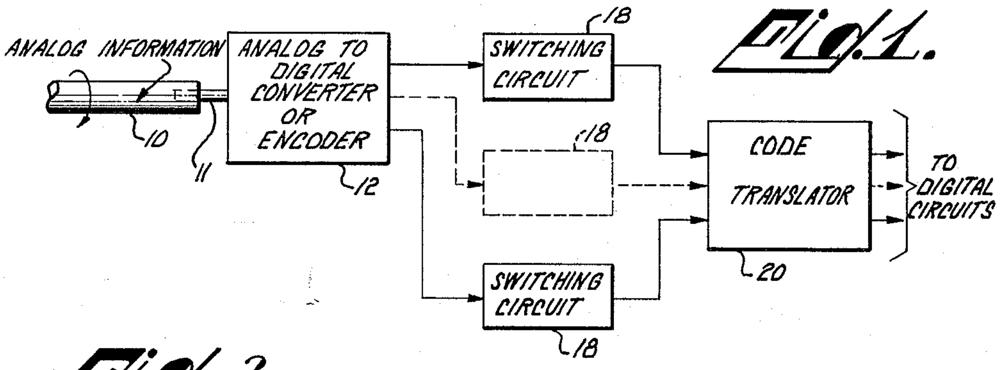
FIG. 1 is a block diagram of the encoder system embodying the invention.

Now referring to FIG. 1, the encoder system will be generally examined. The analog information to be digitized is provided by a revolving shaft, shown as the shaft 10. The shaft 10 is coupled directly, in this instance, to the analog to digital converter or encoder 12 by means of an encoder shaft 11 arranged coaxially therewith. The analog to digital converter or encoder 12 will accordingly be rotatable with the shaft 10, and the various positions of the shaft will be encoded by means of a disc 14 mounted on the encoder shaft 11. The disc 14 is arranged with a plurality of spaced segments of two different kinds shown as conductive and nonconductive segments thereon arranged in a plurality of concentric tracks. The conductive and nonconductive segments may be coded to define binary characters preferably arranged in terms of a monostrophic or cyclic code. The disc 14 is provided with a sensing element or electrical brush means 16 continually engaging and aligned with the tracks on the disc 14 for providing an output indication of the sensed segments. The sensing element 16 may comprise an electrical brush means riding on the surface of the disc and providing binary coded output indications in accordance with the conductive characteristic of the sensed segment. These output indications are in turn coupled to an isolating switching circuit 18 provided for each of the encoder segments or contacts. The switching circuits 18 are arranged to isolate the encoder contacts from the associated load circuit or digital equipment. In this instance, the switching circuits 18 are coupled to a code translator 20 for receiving the signals provided by the switching circuits 18 coded in terms of the cyclic code and translating these signals to a binary coded decimal for use in the associated digital circuits. The code translator 20 may provide the translating action by means of well known relay translating circuits. The contacts of the relays form a matrix whereby the contact closures indicate the decimal digital data.

The switching circuits 18 are provided to continually follow the sensing of the disc 14 whereby to transmit the sensed output indications directly to the code translator 20 without any delay. In other words, the switching circuits 18 provide a serial train of signals corresponding to the serial arrangement of conductive and nonconductive segments on the sensed track.

Figure 3:
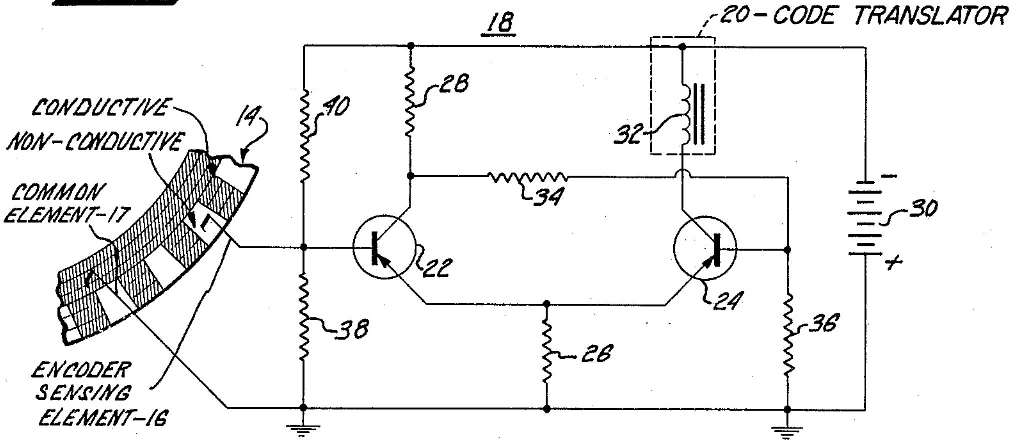
FIG. 3 is a schematic circuit diagram of the switching circuit shown in FIG. 1 with a portion of the encoder disc.
Figure 2:
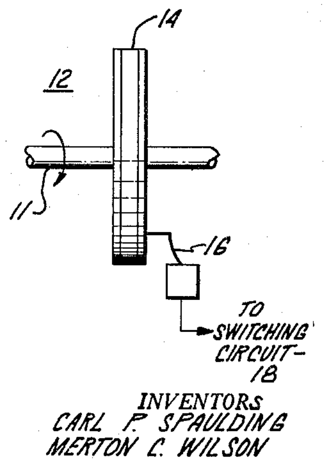
FIG. 2 is a partial elevational view of an encoder with the housing removed.

Now referring to FIG. 3, an examination of a low power switching circuit for use with the encoder 12 will be described. The switching circuit 18 comprises a pair of low power transistors 22 and 24 arranged to respond to the sensing of the conductive and nonconductive segments on the disc 14 to correspondingly switchably change their conductive conditions. To this end, it should be noted that the transistors 22 and 24 are illustrated as being asymmetrically regeneratively cross coupled. The emitter circuits for the transistors 22 and 24 are provided with a common resistive impedance 26 connected to a common reference point or ground. The collector for the transistor 22 is connected to a resistive impedance 28 having one end connected to the negative terminal of the supply source, shown as a battery 30 having its positive terminal connected to ground. The collector electrode for transistor 24 is connected in series circuit relationship with a relay winding 32, having its opposite terminal connected to the negative side of the battery 30. It will be recognized that the relay winding 32 comprises a portion of the code translator 20 and that the energization and de-energization thereof cause the desired code translation.

The transistor 22 is cross coupled to the transistor 24 by means of a voltage divider network connected between the collector of transistor 22 and the base of transistor 24 by means of the resistive element 28, a resistive impedance element 34 connected from said collector and base and a resistive impedance element 36 connected from the base of transistor 24 to the common reference point. The base circuit for the transistor 22 is provided with a resistive impedance 38 connected between the base electrode and ground and is further provided with a resistive impedance element 40 connected thereto and the negative terminal of the battery 30. The base circuit is further arranged with the encoder sensing element 16 arranged in parallel circuit relationship with the resistive impedance element 38. The encoder sensing element 16 is shown diagrammatically arranged with a portion of a coded track of the disc 14. The reference or common track is shown adjacent the coded track. The common track is a continuous conductive track which is provided with a common sensing element or brush 17 connected to ground.

The above circuit has been arranged to continuously follow the rotation of the disc 14 and to unambiguously discriminate between the conductive and nonconductive coded segments for the disc. The circuit is further arranged to assure that the transistors 22 and 24 are always in opposite states, namely one transistor is completely cut off when the other is fully conductive or in a saturated condition. This in turn will assure that the relay winding 32 will be fully energized or fully de-energized.

The operation of the above described switching circuit will be described by assuming that the sensing element 16 is sensing a nonconductive segment as shown. When this condition prevails, the sensing element 16 is in an open circuit or high resistance condition and the transistor 22 will be fully conducting, while the transistor 24 is completely cut off and the relay winding 32 will be de-energized during this sensing interval. Under these conditions, a current will be seen to flow in the emitter-base circuit of transistor 22 and which current will flow from the positive terminal of the battery 30 through the common emitter resistor 26, through the emitter and base circuit of transistor 22, and back to the negative terminal of the battery 30 through the voltage divider resistor 40. The collector current of transistor 22 also will be seen to flow through the common emitter resistor 26 and then through the emitter to collector circuit of transistor 22 through resistor 28 and back to the voltage source 30. Since both the base and collector currents for transistor 22 flow through the common emitter resistor 26, under these conditions a bias voltage will be developed across the resistor 26. The collector of transistor 22 will accordingly be maintained very close to this same voltage value. The voltage dividing action provided by resistors 34 and 36 between the collector of transistor 22 and the ground terminal is so proportioned that when transistor 22 is conducting in a saturated condition, the voltage at the midpoint of this voltage divider or at the base of transistor 24 will be less than the bias voltage developed across the common emitter resistor 26. This will cause the emitter-base circuit of transistor 24 to be back biased and prevent any curent from flowing in this transistor. Accordingly, there will be no current flow through the relay winding 32 and it will be maintained continually de-energized during the interval the sensing element 16 engages a nonconductive segment on the disc 14.

When the disc 14 is rotated to present a conductive segment to the sensing element 16, the conductive condition of the switching circuit 18 changes. The base electrode for the transistor 22 will accordingly be connected to ground potential, and the current in the emitter-base and emitter-collector circuits will be cut off and change the voltage relationship of the voltage dividing circuit provided by resistors 28, 34, and 36. The voltage developed across base resistor 36 of transistor 24 will increase and cause the conduction of transistor 24. The conduction of transistor 24 will accordingly provide a current to energize the relay winding 32. Also, during this interval, with the emitter-base and emitter-collector circuits of transistor 24 conducting, the transistor 22 will be biased well beyond cut-off. It should be noted that this is an important feature of this switching circuit and provides reliability since the encoder sensing element 16 may not be perfect.

Figure 4:
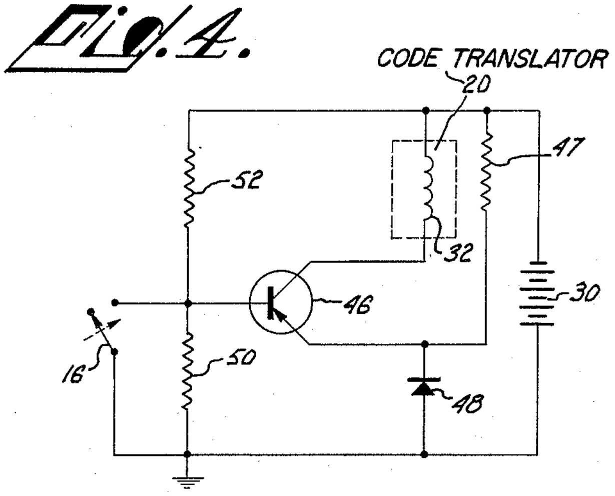
FIG. 4 is a schematic circuit diagram of another embodiment of the switching circuit of FIG. 1.

Now referring to FIG. 4, the high power switching circuit 18 shown will be described. The switching action of this circuit is substantially the same as the circuit described in conjunction with FIG. 3. In this instance, a single high power transistor 46 is utilized to energize the relay coil 32. The transistor 46 has been so arranged to assure that the detection of the two kinds of segments on the disc 16 are unambiguously responded to so that the transistor is either fully conducting or fully nonconducting. The relay coil 32 is shown connected in series with the collector element of transistor 46 and with its opposite terminal connected to the negative terminal of the battery 30. The emitter electrode for transistor 46 is also connected to the positive terminal of the battery 30 by means of a crystal diode 48. A resistor 47 is provided and connected intermediate the emitter electrode and the negative terminal of the source 30. The resistor 47 is proportioned to maintain a current in the diode 48 and thus always assures some bias on the emitter electrode of the transistor 46 to thereby define a threshold level for the switching action. The base circuit is arranged with a pair of series connected resistors 50 and 52 arranged in a voltage dividing network between the positive and negative terminals of the source 30 respectively. The sensing element 16, shown as a switch, is connected in parallel circuit relationship with the resistive element 50 to provide a switching signal to the transistor 46. It will be recognized that when the sensing element 16 engages a nonconducting segment, the base electrode of transistor 46 will be connected to the negative terminal of source 30 through resistor 52. This causes the forward biasing of the transistor 46 to saturation and the relay 32 to become energized. Alternatively, when the sensing element 16 engages a conductive segment, the base electrode is directly connected to the positive terminal of the source 30. During this latter sensing interval, the voltage drop across the diode 48 results in the base electrode becoming positive with respect to its collector electrode and the transistor will be cut off and the relay coil 32 will be de-energized.

The above circuits have been adapted so that upon sensing a contact resistance for a conductive segment of between 0 and 200 ohms, transistors 24 and 46 will always be conducting and non-conducting respectively and a value of contact resistance greater than 2500 ohms or a nonconductive segment will never cause these transistors to obtain these conductive conditions. The resistance values between 200 and 2500 ohms represent an unserviceable encoder.

It will now be seen that this invention provides an improved encoder of not only longer life but the binary characters of the encoder have been unambiguously reproduced as electrical signals.

This unambiguous representation of encoded binary characters is produced regardless of whether the contacts are perfect or imperfect, where imperfect contacts are defined within certain preselected resistance limits as representing perfect contacts.

What is claimed is:

1. In an encoder, a rotatable shaft mounting a disc having at least a continuous single track thereon comprising spaced conductive and nonconductive segments representative of binary coded characters, said rotatable shaft is adapted to be responsive to analog information derived from a revolving shaft, sensing means for continually engaging said disc to serially sense said segments and to provide electrical signals representative of the sensed binary characters, and switching means having two conductive conditions coupled to be continuously and solely responsive to the electrical signals provided by said sensing means for unambiguously reproducing the sensed segments as binary coded electrical characters in terms of the conductive and nonconductive conditions thereof without regard to the direction of rotation of said shaft, said switching means comprising a pair of transistors each having an emitter, collector and base electrode, impedance means coupling the collector electrode of one of said transistors with the base electrode of the other transistor, common impedance means connected to the emitter electrodes of each of said transistors and a point of reference potential, impedance means coupled to the base electrode for the transistor and the point of reference potential, impedance means coupled to the base electrode of said one transistor and a point of negative potential relative to said reference potential, and individual impedance means each separately connected to the collector electrode of one of said transistors and the point of negative potential, and means for applying the electrical signals representative of the sensed binary characters from said sensing means in parallel circuit relationship with the base-emitter circuit of said one transistor connected to said reference potential whereby said transistors are alternately rendered conductive and nonconductive in accordance with the conductive and nonconductive characteristics of the sensed binary characters.

2. In an encoder, a rotatable shaft mounting a disc having at least a continuous single track thereon comprising spaced conductive and nonconductive segments representative of binary coded characters, said rotatable shaft is adapted to be responsive to analog information derived from a revolving shaft, sensing means for continually engaging said disc to serially sense said segments and to provide electrical signals representative of the sensed binary characters, and switching means having two conductive conditions coupled to be continuously and solely responsive to the electrical signals provided by said sensing means for unambiguously reproducing the sensed segments as binary coded electrical characters in terms of the conductive and nonconductive conditions thereof without regard to the direction of rotation of said shaft, said switching means comprising a single transistor having an emitter, collector and base electrode, an asymmetrically conductive element connected between said emitter electrode and a point of reference potential, impedance means connected between said emitter electrode and a point of negative potential relative to said reference potential, means connecting said collector electrode to the point of negative potential, impedance means coupled between the base electrode and the point of negative potential, separate impedance means coupled between the base electrode and the point of reference potential, and means for applying the electrical signals representative of the sensed binary characters in parallel circuit relationship with the latter-mentioned impedance means whereby said transistor is alternatively conductive and nonconductive in accordance with the sensing of said conductive and nonconductive segments.

3. In an encoder, a rotatable shaft mounting a disc having at least a continuous single track thereon comprising spaced conductive and non-conductive segments representative of binary coded characters, said rotatable shaft is adapted to be responsive to analog information derived from a revolving shaft, sensing means for continually engaging said disc to serially sense said segments and to provide electrical signals representative of the sensed binary characters, transistor switching means comprising a pair of transistors asymmetrically, regeneratively cross-coupled arranged to be continuously switchably responsive solely to the electrical signals provided by said sensing means and to be placed in one conductive condition when the electrical signals have a preselected characteristic representative of a conductive segment and in another conductive condition when the electrical signals have a different preselected characteristic representative of a nonconductive segment for unambiguously reproducing the sensed segments as binary coded electrical characters without regard to the direction of rotation of said shaft.

4. In an encoder as defined in claim 3 wherein said switching means provides one conductive condition for segments characterized as having resistance values between 0 and 200 ohms and another conductive condition for segments characterized as having resistance values of over 2,500 ohms.

References Cited in the file of this patent

UNITED STATES PATENTS

| | | |
|---|---|---|
| 2,679,644 | Lippel | May 25, 1954 |
| 2,714,204 | Lippel | July 26, 1955 |
| 2,733,431 | Steele | Jan. 31, 1956 |
| 2,775,727 | Kernahan | Dec. 25, 1956 |
| 2,793,807 | Yaeger | May 28, 1957 |
| 2,879,411 | Faulkner | Mar. 24, 1959 |
| 2,886,753 | Abbott | May 12, 1959 |
| 2,888,673 | Layton | May 26, 1959 |
| 2,892,953 | McVey | June 30, 1959 |
| 2,905,935 | Bolie | Sept. 22, 1959 |
| 2,907,991 | Van Allen | Oct. 6, 1959 |
| 2,974,316 | Guidal et al. | Mar. 7, 1961 |